United States Patent [19]

Culmer et al.

[11] Patent Number: 4,599,634
[45] Date of Patent: Jul. 8, 1986

[54] STRESS INSENSITIVE INTEGRATED CIRCUIT

[75] Inventors: Daniel D. Culmer, Sunnyvale; Robert A. Cometta, San Jose, both of Calif.

[73] Assignee: National Semiconductor Corporation, Santa Clara, Calif.

[21] Appl. No.: 933,867

[22] Filed: Aug. 15, 1978

[51] Int. Cl.[4] ............................................. H01L 27/04
[52] U.S. Cl. ........................................ 357/40; 357/45; 357/26
[58] Field of Search ................... 357/40, 45, 48, 26

[56] References Cited

U.S. PATENT DOCUMENTS

| | | | |
|---|---|---|---|
| 3,477,031 | 11/1969 | Nagata | 357/41 |
| 3,714,527 | 1/1973 | Schmidt | 357/40 |
| 3,729,660 | 4/1973 | Maidique | 357/40 |
| 3,823,354 | 7/1974 | Janssen | 357/40 |
| 3,863,331 | 2/1975 | Schade, Jr. | 357/40 |
| 3,995,304 | 11/1976 | Pease | 357/36 |
| 4,025,941 | 5/1977 | Kanda et al. | 357/48 |

FOREIGN PATENT DOCUMENTS 1906324  9/1969  Fed. Rep. of Germany ........ 357/41

OTHER PUBLICATIONS

Fukahori et al., IEEE J. of Solid State Circuits, vol. SC 11, No. 6, Dec. 1976, pp. 834–846.
Brokaw et al., IEEE J. of Solid-State Circuits, vol. SC-10, No. 6, Dec. 1975, pp. 421–422.

*Primary Examiner*—William D. Larkins
*Attorney, Agent, or Firm*—Gail W. Woodward; Paul J. Winters; Michael J. Pollock

[57] ABSTRACT

An integrated circuit includes a plurality of circuit elements interconnected to operate as a circuit and formed in a common semiconductor substrate. The substrate is mounted on a supporting package, resulting in a mechanical stress in the substrate which is symmetrical about at least one given axis. At least the circuit elements with operating characteristics which are altered by the mechanical stress and which have a critical matching or ratio relationship are arranged symmetrically about the stress axis of symmetry. In a preferred form, the integrated circuit is a linear circuit, such as an operational amplifier employing junction field effect transistors (JFETs) for its input stage and bipolar transistors for its amplifier stage. Providing device symmetry about an axis of mechanical stress symmetry enables shifts in input offset voltage for such operational amplifiers to be reduced up to a factor of about 10.

15 Claims, 5 Drawing Figures

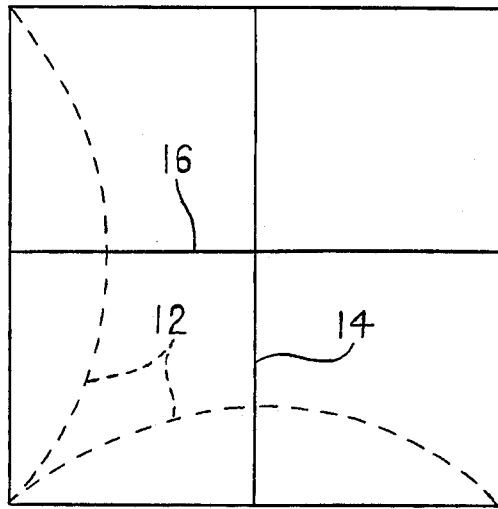
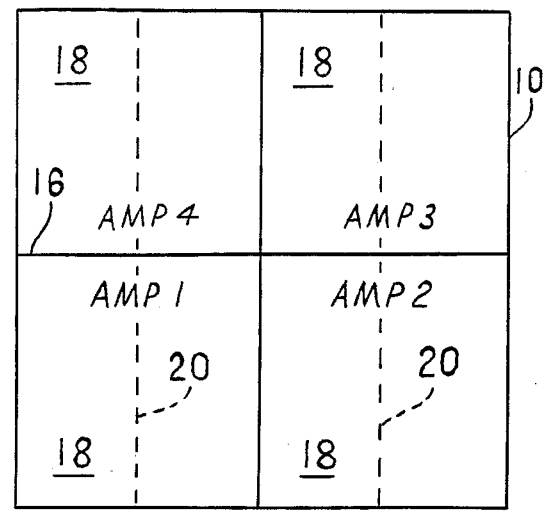
FIG.1A
FIG.1B
(PRIOR ART)
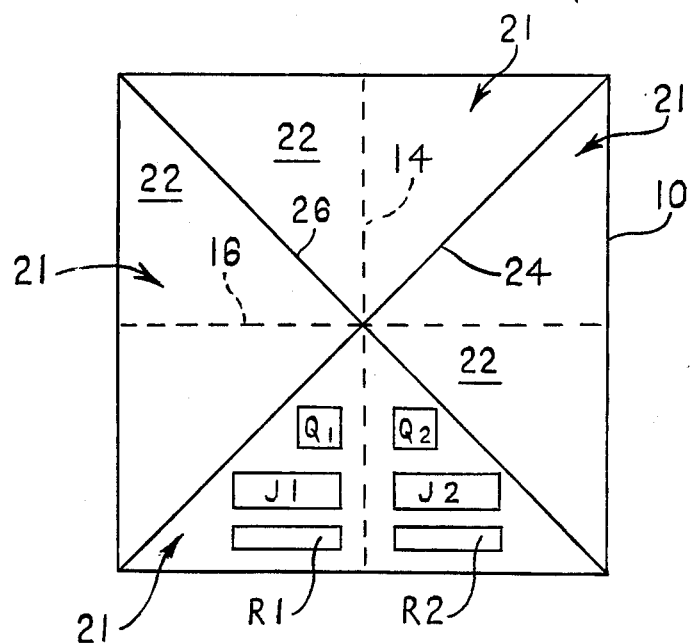
FIG.1C

STRESS INSENSITIVE INTEGRATED CIRCUIT

BACKGROUND OF THE INVENTION

1. Field of the Invention

This invention relates to an improvement in integrated circuit layouts. More particularly, it pertains to a layout scheme for integrated circuits in which alteration of the circuit operating characteristics produced as a result of mechanical stresses imposed by packaging a semiconductor substrate including the integrated circuit are minimized. Most especially, it relates to a layout scheme in which certain critical circuit elements, the performance of which is altered by mechanical stress, are positioned in a semiconductor substrate including them in such a manner as to minimize the effect on overall circuit performance of the alteration of performance characteristics of the circuit elements produced by mechanical stress.

2. Description of the Prior Art

It is known to provide certain kinds of symmetry in integrated circuit layouts for certain purposes. For example, Agusta et al, U.S. Pat. No. 3,508,209 teaches the use of vertical, horizontal and diagonal symmetry for space-saving purposes in the layout of memory array integrated circuits.

Solomon, "The Monolothic Op Amp, A Tutorial Study," IEEE Journal of Solid State Circuits, Volume SC-9, No. 6, December 1974, discloses the provision of operational amplifier input transistors on isothermal lines of an integrated circuit substrate in order to increase the maximum usable DC gain obtainable with the operational amplifier.

In linear integrated circuits, a matched or ratio relationship between certain circuit elements, such as resistors and transistors, is required in order to obtain desired output signals in response to predetermined input signals. If the matching or ratio relationship between these circuit elements is not maintained, the circuit may have an undesirably limited operating range or even be totally unsuited for its intended use. Such common linear integrated circuits as operational amplifiers, voltage regulators and voltage comparators are subject to this constraint.

As integrated circuit technology has become more and more sophisticated, there has been a general tendency to provide transistors making up the circuits in thinner and thinner layers. For example, a typical prior art bipolar transistor operational amplifier has transistor junction depths of about three microns. Changes due to mechanical stress in the operating characteristics of transistors formed with these junction depths have not been a serious problem in practice. However, a newer technology incorporates JFET as input devices for operational amplifier circuits. Such JFETs typically have junction depth of about 1,000 Å, or 0.1 micron. Metal oxide silicon (MOS) FETs are similarly surface effect devices with comparable junction depths. Transistors which are this thin are significantly more sensitive to changes in their operating characteristics due to mechanical stresses obtained while mounting a semiconductor substrate including them in a package than circuit elements with greater junction depths.

Thus, while the integrated circuit art is a well developed one, an increasing need presently exists for integrated circuits including critical stress-sensitive type circuit elements, which circuits are not sensitive to changes in their operating characteristics due to mechanical stress.

SUMMARY OF THE INVENTION

Accordingly, it is an object of this invention to provide an improved integrated circuit structure in which changes in circuit performance induced by mechanical stresses of the structure are minimized.

It is a further object of the invention to provide a technique for incorporating critical circuit elements of a normally stress-sensitive type into an integrated circuit without making the integrated circuit stress sensitive.

It is another object of the invention to provide an integrated circuit including surface effect devices which is not sensitive to mechanical stresses induced in packaging the circuit.

It is yet another object of the invention to provide linear integrated circuits including circuit elements with a critical matching or ratio relationship and which are subject to performance changes due to mechanical stress, in which the matching or ratio relationship is maintained despite changes in the mechanical stress of the integrated circuit after the critical circuit elements have been fabricated.

It is still another object of the invention to provide an operational amplifier integrated circuit including a JFET input stage having a substantially reduced input offset voltage shift produced by packaging the integrated circuit.

The attainment of these and related objects may be achieved through use of the novel integrated circuit disclosed herein. An integrated circuit in accordance with the invention includes a plurality of circuit elements interconnected to operate as a circuit and formed in a common semiconductor substrate. The semiconductor substrate is mounted in a supporting package. As a result of being mounted in the package, the semiconductor substrate has a mechanical stress which is symmetrical about at least one given axis. At least those of the circuit elements with operating characteristics which are altered by mechanical stress are arranged symmetrically about at least one given axis. In particular, transistor and resistor pairs which interact in operation of the circuit and which require a matched or ratio relationship between them are arranged in corresponding positions on either side of the axis of mechanical stress symmetry. This means that equal alteration in the operating characteristics of each transistor or resistor in the pair are produced. As a result, the changes in operating effects do not materially change the matching or ratio relationship between the circuit element, thus producing an integrated circuit which is substantially less sensitive to mechanical stresses than similar integrated circuits in which circuit elements are not arranged symmetrically about a mechanical stress axis of symmetry. Since a matched relationship between devices is simply a special case of a ratio relationship in which the ratio is 1:1, the more generic ratio terminology will be used herein to encompass matching.

In a preferred embodiment, the invention is implemented with an operational amplifier integrated circuit employing surface effect JFETs or MOSFETs as their input stage and bipolar transistors as the amplifier stage. In such a circuit, shifts in input offset voltsge may be reduced by a factor of about 10 by arranging certain JFETs or MOSFETs, bipolar transistors and resistors symmetrically about a mechanical stress axis of symmetry in the circuit, in accordance with the invention.

The attainment of the foregoing and related objects, advantages and features of the invention should be more readily apparent after review of the following more detailed description of the invention, taken together with the drawings, in which:

BRIEF DESCRIPTION OF THE DRAWINGS

FIG. 1A is a plan view of a typical stress diagram of an integrated circuit after mounting on a supporting substrate;

FIG. 1B is a similar schematic representation of an integrated circuit, showing a typical prior art layout;

FIG. 1C is a similar schematic representation of an integrated circuit substrate in which the circuit is laid out in accordance with the invention;

DETAILED DESCRIPTION OF THE INVENTION

Figure 2:
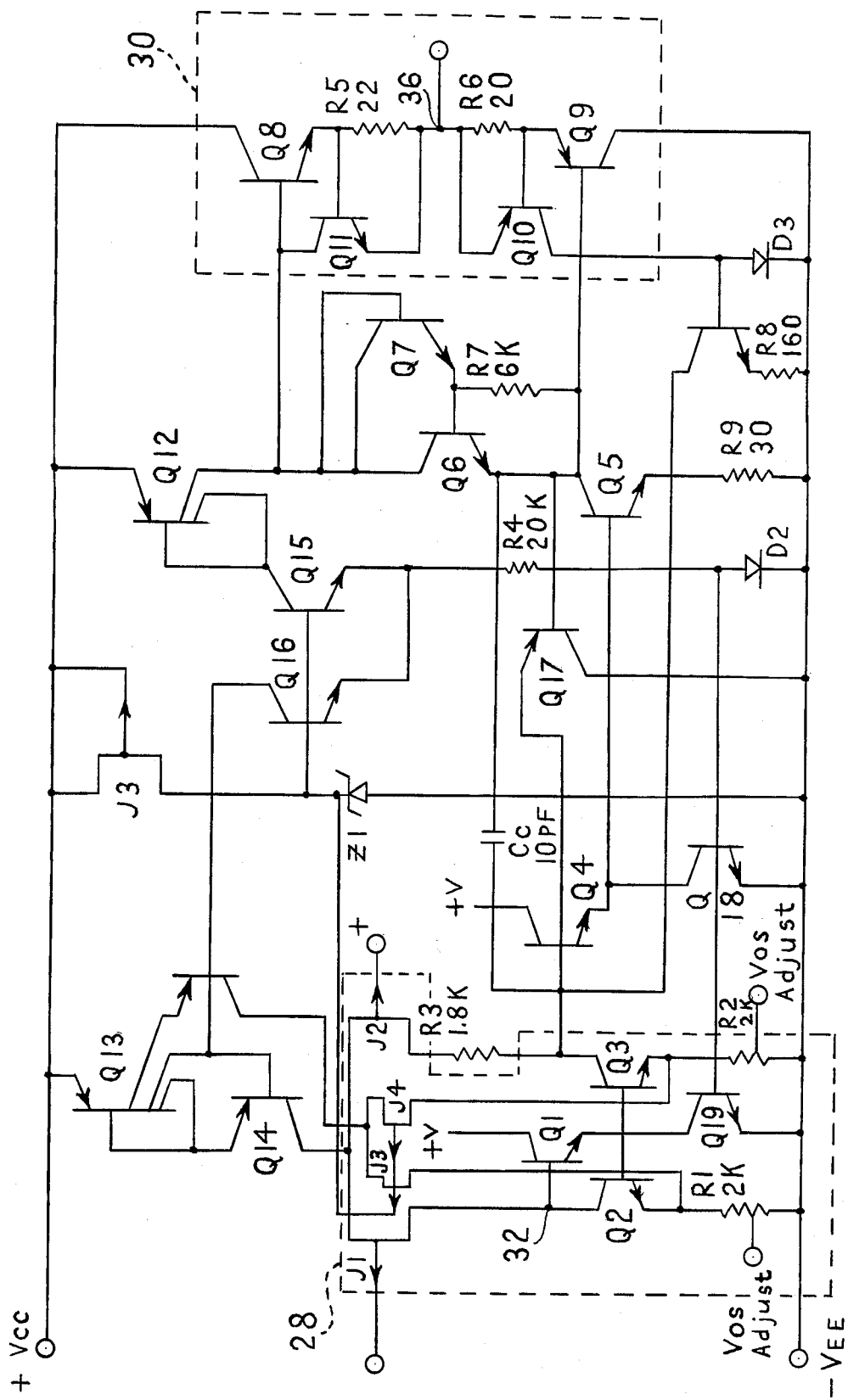
FIG. 2 is a schematic diagram of an operational amplifier circuit with which the present invention may be practiced.

Turning now to the drawings, more particularly to FIG. 1A, a stress diagram useful for an understanding of the present invention is shown. As a result of mounting silicon substrate 10 containing the integrated circuit on a supporting substrate, mechanical stress is induced in the silicon substrate. This stress is represented by stress lines 12 as shown. The supporting substrate (not shown) is typically ceramic or a metal lead frame. The silicon substrate 10 is mounted on the supporting substrate by means of conventional die attachment and connecting wires are attached to terminals of the integrated circuit arranged around the periphery of substrate 10. Alternatively, the silicon substrate 10 may be mounted on a supporting substrate with its surface containing the integrated circuit elements mounted face down by use of solder reflow techniques. In any event, mechanical stress as represented by the stress lines 12, will be induced in the silicon substrate 10.

Assuming a rectilinear shape for the silicon substrate 10, the stress lines 12 have two axes 14 and 16 of stress symmetry at 90° to each other. In accordance with the invention, critical circuit elements of the integrated circuit with operating characteristics changed by mechanical stress are disposed symmetrically about the axes 14 and 16.

Turning now to FIG. 1B, there is shown a representative layout of a quad operational amplifier integrated circuit i.e., an integrated circuit containing four separate operational amplifiers 18. The conventional practice is to simply divide the integrated circuit chip into four quadrants along the axes 14 and 16, and then lay out each amplifier in its respective quadrant. Comparing FIGS. 1A and 1B, it should be noted that the axes of stress symmetry coincide with the division of the chip into four quadrants.

In accordance with usual practice, circuit elements making up each of the operational amplifiers 18 are disposed symmetrically around a center line 20 for each amplifier. However, consideration of the stress lines 12 in Figure 1A shows that mechanical stress induced in the silicon substrate 10 in FIG. 1B by mounting the substrate on a package will produce unequal effects on the devices disposed symmetrically about center line 20. In a typical operational amplifier circuit, the result of this different stress effect on the circuit elements of the amplifier is to produce a shift of about 12 millivolts in the input offset voltage of the circuit. Since an input offset voltage of about 15 millivolts is a typical specification for even a relatively low cost operational amplifier, such a shift is highly undesirable. It may further be noted that an input offset voltage for an operational amplifier which is characterized as low would be about 1 millivolt. It thus should be apparent that the shift in input offset voltage for a typical surface effect operational amplifier not incorporating the present invention is a significant problem.

Turning now to FIG. 10, there is shown a layout for a quad operational amplifier integrated circuit in accordance with the present invention. As beofre, it will be noted that the silicon substrate 10 is divided into four quadrants by the intersecting axes of stress symmetry 14 and 16. However rather than merely providing each amplifier in the four quadrants so defined, the substrate 10 is divided into four triangular shaped quadrants 21 by diagonal lines 24 and 26 running between opposed corners of the substrate 10. The axes of stress symmetry 14 and 16 then pass through the center of each triangular quadrant 21.

With the axes of stress symmetry 14 and 16 passing through the center of each amplifier 22, critical circuit element of the operational amplifiers 22 which have a ratio requirement may be disposed symmetrically on either side of the axis of stres symmetry passing through the amplifier. Thus, diffused resistors R1 and R2 are disposed opposite each other on either side of the axis 14 of stress symmetry. JFETs J1 and J2 and bipolar transistors Q2 and Q3 are similarly arranged, as shown. Considering the stress lines 12 shown in FIG. 1A, it should be apparent that alteration in the electrical characteristics of resistors R1 and R2, JFETs J1 and J2 and bipolar transistors Q2 and Q3 should be equal for each pair of devices. As a result, it is found that operational amplifier circuits laid out in accordance with the arrangement shown in FIG. 1C, exhibit a far lower shift in their input offset voltages as a result of assembly in a semiconductor package. Thus, the same operational amplifier circuit which produced a 12 millivolt shift in input offset voltage when laid out in accordance with FIG. 1B produces an input offset voltage shift between about 1 and 2 millivolts when laid out as shown in FIG. 1C.

Figure 3:
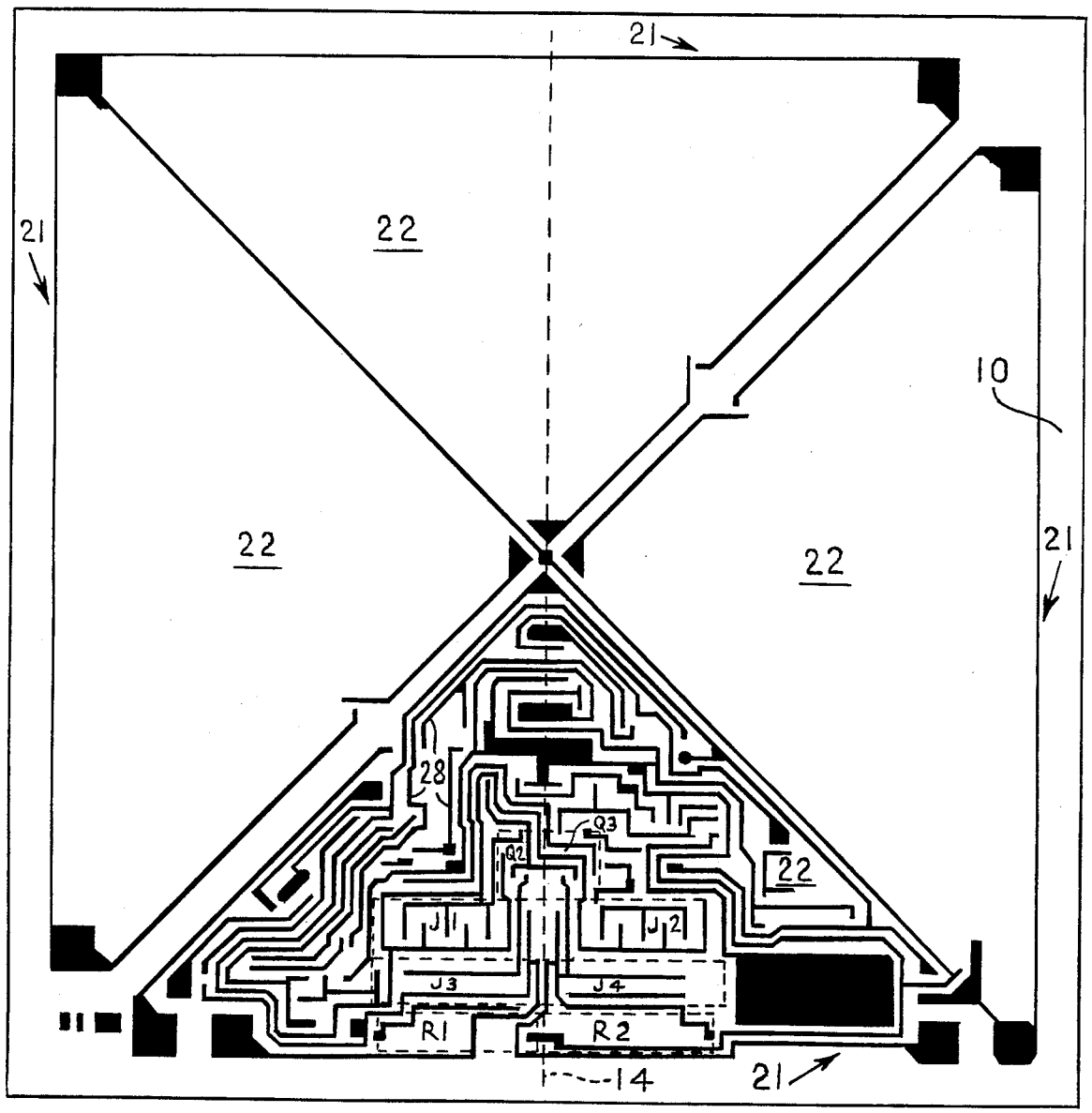
FIG. 3 is a plan view of a metallization pattern for an integrated circuit employing the schematic of FIG. 2 and laid out in accordance with the invention.

FIGS. 2 and 3 show a preferred embodiment of the invention. FIG. 2 is a schematic diagram of the operational amplifier circuit which is employed for each of the operational amplifiers 22 as shown in the layout of FIG. 3. As shown in FIG. 2, the circuit includes an input stage 28, an output stage 30, and an amplification stage, which can be considered to be essentially the remainder of the circuit in FIG. 2. It should be noted that gain is obtained in the input stage 28 as well as the amplifier stage.

The circuit elements in this operational amplifier which have a critical ratio requirement are all included in input stage 28. The positioning of these circuit elements in the layout of FIG. 3 may be seen through the use of corresponding designations Q2, Q3, J1, J2, J3, J4, R1 and R2 in FIGS. 2 and 3. JFET transistors J1 and J2 have the negative and positive inputs respectively of the operational amplifier supplied to their gates. These input signals control the application of current from bipolar transistors Q13 and Q14, operated as a current source, to nodes 32 and 34 through JFETs J1 and J2, respectively. JFETs J3 and J4 are trimmed for input offset voltage adjustment. Further input offset voltage adjustment is obtained with resistors R1 and R2.

The devices shown disposed on opposite sides of the axis 14 of stress symmetry in FIG. 3 have matched properties, i.e., a ratio of 1:1 in certain critical parameters. In the case of the JFETs J1–J4, the critical parameter is the saturation drain current (IDSS). In the case of the bipolar transistors Q2 and Q3, the critical parameter is the base-emitter voltage (VBE). In the case of resistors R1 and R2, the critical parameter is resistance (R). Other properties of the devices may be matched as well, but these are the most important in this circuit. A ratio of, e.g., 2:1, 5:1, or 10:1 in these or other properties could also be maintained through use of this invention.

In operation of the circuit, upward and downward shifts in potential at nodes 32 and 34 produced as a result of variation of the negative and positive input voltages to JFETS J1 and J2 produce corresponding but amplified upward and downward shifts in output voltage VO at node 36 through output bipolar transistors Q8 and Q9. Bipolar transistors Q10 and A11 serve as negative and positive current limiting devices, respectively. Transistors Q18 and Q19 function as current sources to bias transistors Q1 and Q4 up. Transistors Q4 and Q5 provide a high beta ($\beta$) in the amplifier stage. JFET J3, bipolar transistors Q15 and Q16, zener diode Z1, resistor R4 and diode D2 constitute a bias circuit. Bipolar transistors Q6, Q7 and Q12 constitute a current source.

Since this circuit itself does not constiute part of the present invention, its operation will not be discussed further. Interested readers are directed to the above-referenced Solomon article for further information on operational amplifiers in general and to National Semiconductor Data Sheet IM-B25M48, dated April 1978 for the LF 353, LF 354 Wide Band Dual JFET Input Operational Amplifiers for further information on the circuit. It should be noted that the circuit for the LF 353 and LF 354 operational amplifiers is identical to that shown in FIG. 2, except that it does not include the trimmed JFETs J3 and J4 shown in FIG. 2.

The circuit shown in FIG. 2 may be implemented in integrated circuit form using the layout shown in FIG. 3. As before, the circuit elements of each operational amplifier 22 are formed in silicon substrate 10 through a combination of diffusion, ion implantation, oxidation and etching steps in accordance with procedures known in the art. For example, a process which will produce JFETs and bipolar transistors in a common substrate in accordance with the teachings of commonly assigned Dunkley and Dobkin application Ser. No. 716,049, filed Aug. 20, 1976 the disclosure of which is incorporated by reference herein, may be utilized to form the circuit elements. Interconnection metallurgy 28, serving to interconnect the various circuit elements to give an operational amplifier in accordance with the schematic of FIG. 2, is provided through the vacuum evaporation and etching of an aluminum layer in a known manner. While only the interconnection metallurgy in one of the four operational amplifiers 22 is shown in FIG. 3, essentially identical interconnection metallurgy is employed for the operational amplifiers 22 in the other three quadrants 21 of semiconductor substrate 10.

As shown, axis of symmetry 14 bisects the operational amplifier 22 in the lower portion of the layout into two right triangles. Diffused resistors R1 and R2 are of generally rectangular shape and extend to the left and right respectively of the axis of stress symmetry 14. Junction field effect transistors J1, J2, J3 and J4 extend in a similar manner symmetrically about the axis of stress symmetry 14. Bipolar transistors Q2 and Q3 are disposed in a like manner above JFETs J1 and J2, as shown.

The concept utilized in the above operational amplifier integrated circuit may be employed with other circuits than that shown. For example, MOSFETs may be used in place of JFETs in the input stage of an operational amplifier. The symmetry of critical devices approach may also be employed with other linear circuits, such as voltage regulators and comparators, which also require maintenance of ratios in operating characteristics between certain devices. Indeed, the concept may be employed with any integrated circuit, linear or digital, to preserve critical device ratios from alteration due to mechanical stress effects.

It should now be apparent to those skilled in the art that an integrated circuit capable of achieving the stated objects of the invention has been provided. By disposing circuit elements symmetrically about an axis of mechanical stress symmetry in a semiconductor substrate in its packaged form, shifts in operating characteristic ratios of circuit elements whose performance is altered by mechanical stress are substantially reduced. As a result, the integrated circuits are far less sensitive to mechanical stress than prior art integrated circuits. Thus, integrated circuits may be fabricated to meet very stringent electrical operating characteristics without attempting to compensate for shifts in operating characteristics produced when the semiconductor substrate incorporating the circuit is assembled into an integrated circuit package.

It should further be apparent to those skilled in the art that various changes in form and details of the invention may be made. It is intended that such changes be included within the spirit and scope of the claims appended hereto.

What is claimed is:

1. In a linear integrated circuit including a plurality of surface effect circuit elements having a critical ratio relationship in operating characteristics between at least some of said plurality of surface effect circuit elements, said circuit elements being formed in a common semiconductor substrate, which substrate has a mechanical stress which is symmetrical about at least one given axis, said surface effect circuit elements exhibiting a change in operating characteristics in response to the mechanical stress, the improvement which comprises arranging at least those of said plurality of surface effect circuit elements having a critical ratio relationship and exhibiting the changes in operating characteristics as a result of the mechanical stress symmetrically about the axis of mechanical stress symmetry.

2. The integrated circuit of claim 1 in which the circuit elements are transistors.

3. The integrated circuit of claim 2 in which the transistors include field effect transistors.

4. The integrated circuit of claim 3 in which the transistors include junction field effect transistors.

5. The integrated circuit of claim 3 in which the field effect transistors are metal oxide silicon field effect transistors.

6. An integrated circuit which comprises a plurality of surface effect circuit elements having a critical ratio relationship in operating characteristics between at least some of said surface effect circuit elements interconnected to operate as a circuit and formed in a common semiconductor substrate mounted in a supporting package, said mounted substrate having a mechanical stress which is symmetrical about at least one given axis, at least those of said surface effect circuit elements with operating characteristics which are altered by the mechanical stress and which have the desired ratio relationship in at least one operating characteristic being arranged symmetrically about the at least one given axis.

7. The integrated circuit of claim 6 in which the circuit elements comprise transistors.

8. The integrated circuit of claim 7 in which the transistors are metal oxide silicon field effect transistors.

9. The integrated circuit of claim 7 including at least two junction field effect transistors.

10. The integrated circuit of claim 7 in which the circuit is a high gain differential amplifier circuit.

11. An integrated circuit containing a plurality of circuit elements interconnected to operate as four high gain differential amplifiers and formed in a common rectilinear semiconductor substrate mounted in a supporting package, said mounted substrate having mechanical stresses which are symmetrical about two intersecting orthogonal axes, the four amplifiers each being formed in a triangular shaped region bisected by one of said axes, with at least those circuit elements having operating characteristics which are altered by the mechanical stresses and for which a critical ratio in operating characteristics must be maintained being arranged symmetrically about the axis bisecting the triangular region in which the circuit elements are located.

12. The high gain differential amplifier of claim 11 in which the circuit elements comprise transistors.

13. The high gain differential amplifier of claim 12 including at least two field effect transistors.

14. The circuit of claim 12 in which the transistors are junction field effect transistors.

15. The circuit of claim 12 in which the transistors are metal oxide silicon field effect transistors.

* * * * *